United States Patent [19]  
Van Vliet et al.

[11] Patent Number: 4,581,583  
[45] Date of Patent: Apr. 8, 1986

[54] APPARATUS FOR SAMPLE SELECTING, PLACING AND RETRIEVING FOR USE WITH NMR SPECTROMETERS

[75] Inventors: Roy D. Van Vliet, San Jose; James F. Gordon, Saratoga, both of Calif.

[73] Assignee: General Electric Company, Milwaukee, Wis.

[21] Appl. No.: 584,568

[22] Filed: Feb. 29, 1984

[51] Int. Cl.⁴ .................. G01N 24/02; G01N 35/04; G01N 35/06
[52] U.S. Cl. ................................ 324/321; 73/863.91
[58] Field of Search .......................... 324/321, 450; 73/863.91, 863.24; 209/552, 919, 922, 643, 906; 414/223, 744 B

[56] References Cited

U.S. PATENT DOCUMENTS

3,434,594  3/1969  Husome ................. 209/643
4,246,537  1/1981  Laukien et al. ......... 324/321
4,363,235  12/1982 Vulliens et al. ........ 73/863.91
4,365,199  12/1982 McNair ................. 324/321

Primary Examiner—Reinhard J. Eisenzopf  
Assistant Examiner—G. Peterkin  
Attorney, Agent, or Firm—Alexander M. Gerasimow; Douglas E. Stoner

[57] ABSTRACT

A sample selecting, positioning and retrieving mechanism embodies a carousel having preferably inner and outer concentric rows of cylindrical tubes placed vertically between parallel upper and lower carousel plates. Each vertical tube is equipped with a retaining catch to maintain a sample in its resting position until it is released into a probe situated in a polarizing magnetic field and, conversely, to hold it in the rest position after it has been returned from the probe. A detent mechanism sequentially advances the carousel, one tube at a time, until all of the samples in one of the rows have been processed. A movable shifter plate, on which the carousel is journalled, repositions the carousel such that the other sample row is in alignment with the magnet air column. The mechanism is preferably enabled for movement by pneumatic cylinders and is capable of manual or unattended, programmed operation under computer control.

5 Claims, 14 Drawing Figures

DROP SEQUENCE

APPARATUS FOR SAMPLE SELECTING, PLACING AND RETRIEVING FOR USE WITH NMR SPECTROMETERS

BACKGROUND OF THE INVENTION

This invention relates to nuclear magnetic resonance (NMR) spectrometers. More specifically, this invention relates to a mechanism for selecting and positioning for analysis in the polarizing field of a spectrometer one of a plurality of test-tube-like sample holders (sample holder hereinafter). The sequence of steps can be performed either manually or automatically without the presence of an operator.

One known mechanism utilized in NMR spectrometers for selecting one of a plurality of sample holders, positioning the sample in the polarizing magnetic field for study, and then returning the sample utilizes a robotic arm. The robotic arm is used to select the sample from a storage stable. The sample is then maneuvered into position above the air column of a magnet, used for producing the polarizing field, and released. The sample drops into position within a probe where it is analyzed. Upon completion of the analysis, the sample is returned to the top of the air column where the robotic arm clasps it and returns it to the storage stable. As may be expected, such a mechanism is very complex and somewhat in its operation.

It is, therefore, a principal object of the present invention to provide an improved NMR spectrometer including an improved mechanism for selecting, positioning and retrieving a sample at an increased rate.

It is another object of the invention to provide an NMR spectrometer including a mechanism for selecting, positioning and retrieving a sample which does not require modifications to the existing magnet structure.

It is yet another object of the invention to provide an improved NMR spectrometer including a mechanism for selecting, positioning and retrieving a sample which is capable of either manual or automatic computer-controlled operation.

SUMMARY OF THE INVENTION

A gyromagnetic resonance spectrometer apparatus includes a probe structure for holding a sample to be analyzed in an unidirectional magnetic field, means for supporting a plurality of sample holders, a passageway communicating with the means for supporting and the probe structure through which the sample holders are loaded and retrieved from the probe, and means for exciting and detecting a gyromagnetic resonance of the sample immersed in the polarizing magnetic field. The sample holders are releasably supported and are arranged in at least two rows. Means are provided for sequentially loading and ejecting successive ones of the samples from the probe structure. Sensing means is provided for sensing when the samples in one of the rows have been analyzed and for shifting the support means so as to align the other row of sample holders with the passageway to enable sequential analysis thereof.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

DETAILED DESCRIPTION OF THE INVENTION

Figure 1:
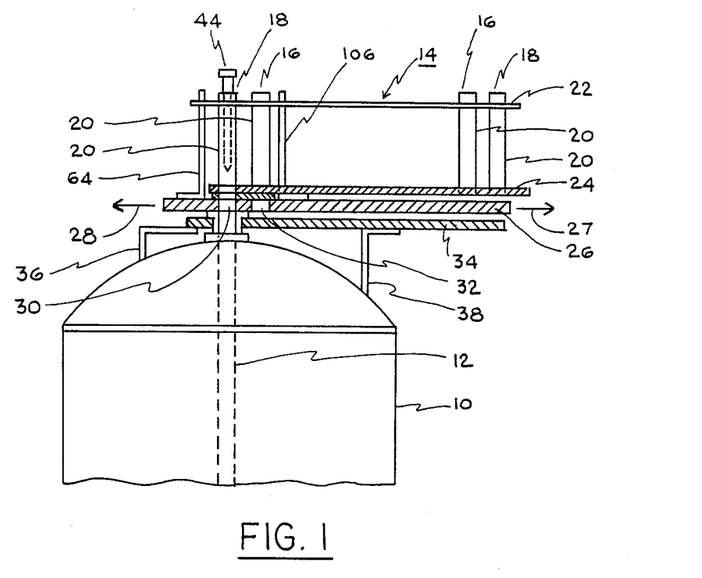
FIG. 1 depicts a magnet including a sample changer incorporating features of the present invention.

FIG. 1 illustrates a magnet 10, preferably of superconductive construction, which includes an air passageway 12 and a sample-changer carousel 14, preferably having two concentric inner and outer rows 16 and 18 of vertical cylindrical tubes (chutes) 20 held in place between upper and lower carousel plates 22 and 24, respectively. Each vertical tube is equipped to maintain a sample holder 44 in its "rest" position until it is released into the probe by means of passageway 12 and, conversely, to hold it in the "rest" position after it has been returned from the probe. In one embodiment, each of the concentric rows comprises 50 tubes thereby providing facilities for holding up to 100 samples. It will be recognized that the number of tubes in each row as well as the number of concentric rows may be selected to be other than 50 and 2, respectively. It should also be noted that the carousel and related parts are constructed from non-magnetic materials such as aluminum and plastic to minimize interference with spectrometer operation.

Continuing with reference to FIG. 1, the carousel is rotatably mounted on a shifter plate 26 which is enabled for bidirectional movement in the directions indicated by arrows 27 and 28 so as to position one of the openings 30 and 32 formed therein over passageway 12 thus enabling selection of samples from either the inner or outer row. Typically, all of the samples in one of the rows are analyzed, and the shifter plate then moved to enable the analysis of samples in the other row. Shifter plate 26 is supported by a fixed plate 34 which is mounted to the cover of magnet 10 by any convenient means such as, for example, brackets 36 and 38. This arrangement allows a large number of samples to be available for analysis without requiring redesign of the magnet structure.

Figure 2:
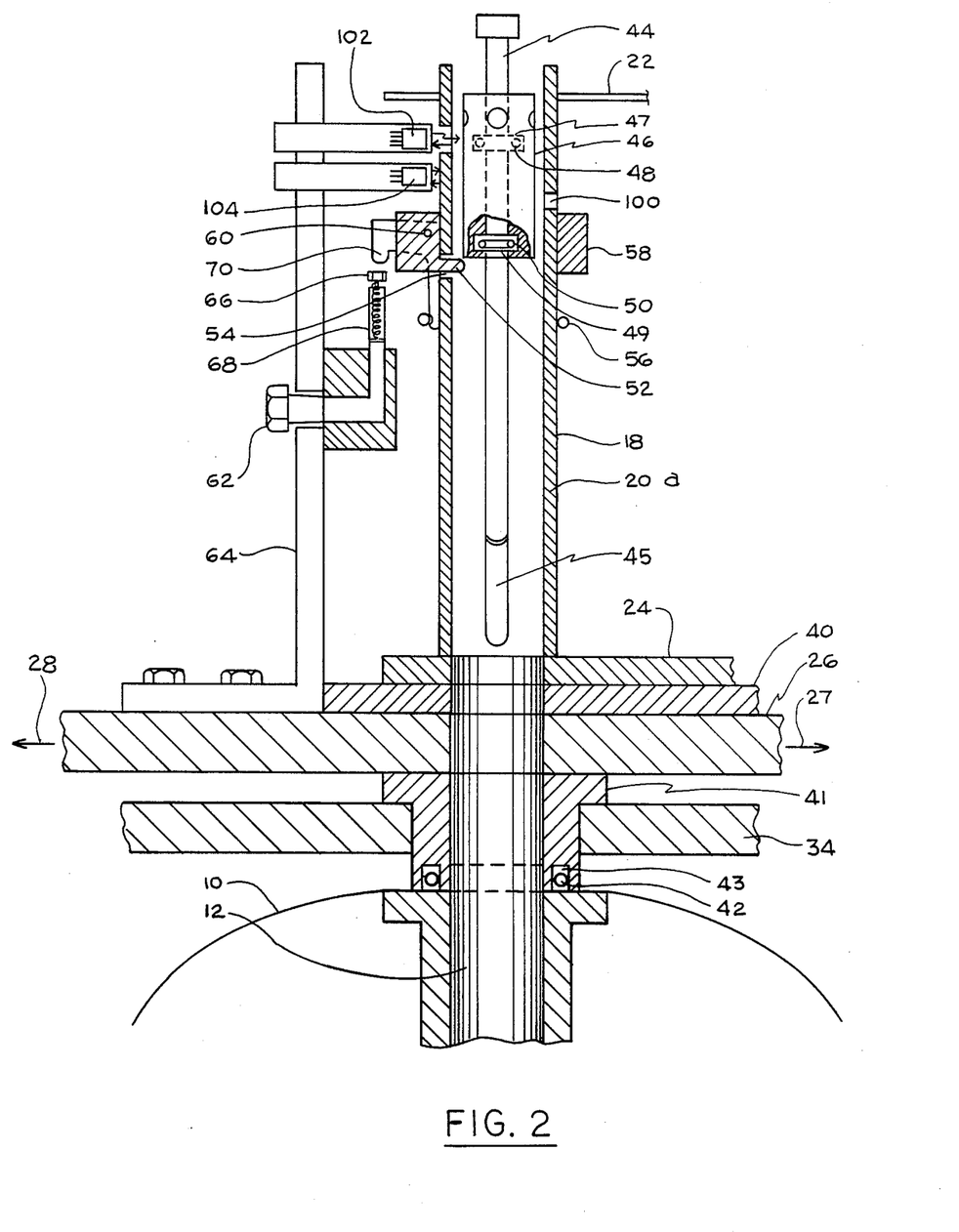
FIG. 2 is a partial sectional view of a single chute, including a sample holder.

FIG. 2, in which like parts are assigned the same reference numbers as in FIG. 1, illustrates in greater detail the construction of the carousel. An air seal is formed by a plate 40 of a suitable material, such as Delrin plastic, positioned between the lower surface of lower carousel plate 24 and the upper surface of shift plate 26. A seal 41 of similar material is also provided between the lower surface of the shift plate and the upper surface of fixed plate 34. An O-ring 42 residing in a groove 43 formed in seal 41 prevents the escape of compressed gas at the top of passageway 12.

Each of chutes 20 in carousel 14 (FIG. 1) is equipped to hold in a "rest" position a sample holder. The manner in which this is accomplished will now be described by way of example by again referring to FIG. 2 which depicts sample holder 44 containing a sample material 45 which is depicted as a liquid but which, of course, may be solid or gaseous. The upper portion of sample holder 44 resides within a hollow cylindrical spinner 46 fabricated from a non-magnetic, non-conductive material, such as Teflon resin, and is held therein by a pair of O-rings 48 and 50 situated in a pair of grooves 47 and 49, respectively. The sample holder and spinner assembly is supported within a vertical chute 20a, which forms part of the outer concentric row 18, by means of a catch 52 which passes through an opening 54 formed in chute 20a. The catch is biased to support the assembly in its rest position by means of an O-shaped spring 56. Catch 52 is supported by a collar 58 which is mounted on chute 20 and is pivotted therein by a pivot point 60 such that, when compressed gas is applied to fitting 62 supported on vertical bracket 64 mounted on shift plate 26, plunger 66 of a pneumatic cylinder 68 is activated and pushes against a point 70 of catch 22 thereby causing it to release the sample holder assembly. The catch 52 is preferably operated by a pneumatic cylinder to avoid interference from the polarizing magnetic field, but in some applications could also be operated by a solenoid.

Figure 3:
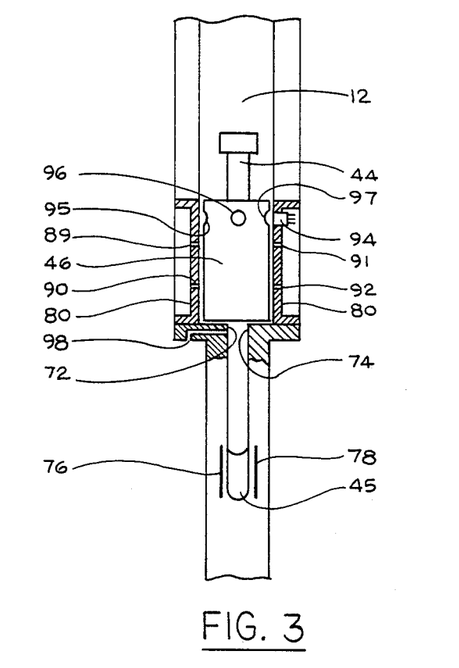
FIG. 3 is a partial sectional view of a sample holder in position within the probe.
Figure 3A:
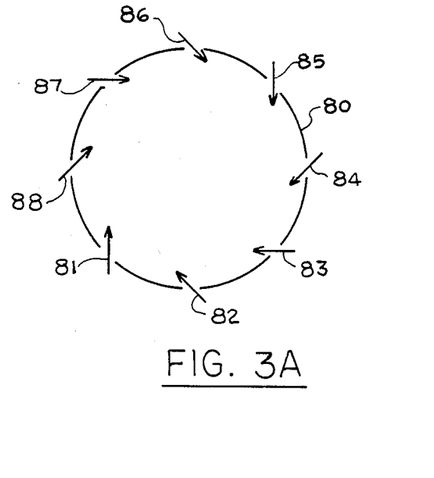
FIG. 3a illustrates direction of compressed gas flow used to spin the sample.

The released sample holder and spinner travel downward through passageway 12, as seen in FIG. 3, such that the spinner comes to rest against shoulders 72 and 74 of passage 12 and rests between a stator 80 of a gas turbine so that sample 45 is positioned for analysis in the polarizing magnetic field produced by magnet 10 (FIG. 1) between RF probe coils designated 76 and 78. Spinner 46 constitutes the rotor of the gas turbine and can be made to rotate by applying pressurized gas from points located around the stator from directions designated by arrows 81–88 as shown in FIG. 3a. The flow of the pressurized gas creates a vortex within the turbine stator, such that the frictional force of the gas against the spinner causes the rotation thereof in typically the clockwise direction. The compressed gas used to spin the sample is vented through openings 89–92 provided in the stator assembly. Due to the fact that it is desirable to spin the sample at a predetermined speed, a light-emitting diode (LED)/phototransistor assembly 94 is provided to monitor the rotational speed. The manner in which this is accomplished is to detect the reflection of the LED light output from reflective areas, such as areas 95–97, provided on the spinner. The LED/phototransistor assembly 94 can also be used to detect reflected light from either the spinner, itself, or one of reflective areas 95–97 to determine whether the spinner has in fact arrived at the probe after having been released. Upon completion of the analysis, pressurized gas is applied through opening 98, for example, creating a pressure differential and forcing the spinner and sample holder assembly to return to their at-rest position in the chute. Referring again to FIG. 2, the pressurized gas forcing the assembly upward is vented through a vent opening 100 formed above support collar 58. The vent opening limits the height to which the sample holder assembly is ejected. To prevent the sample holder from ejecting itself out of the chute due to excess momentum, catch 52 is not retracted when the sample is returned to its rest position and serves as a braking mechanism.

Figure 4:
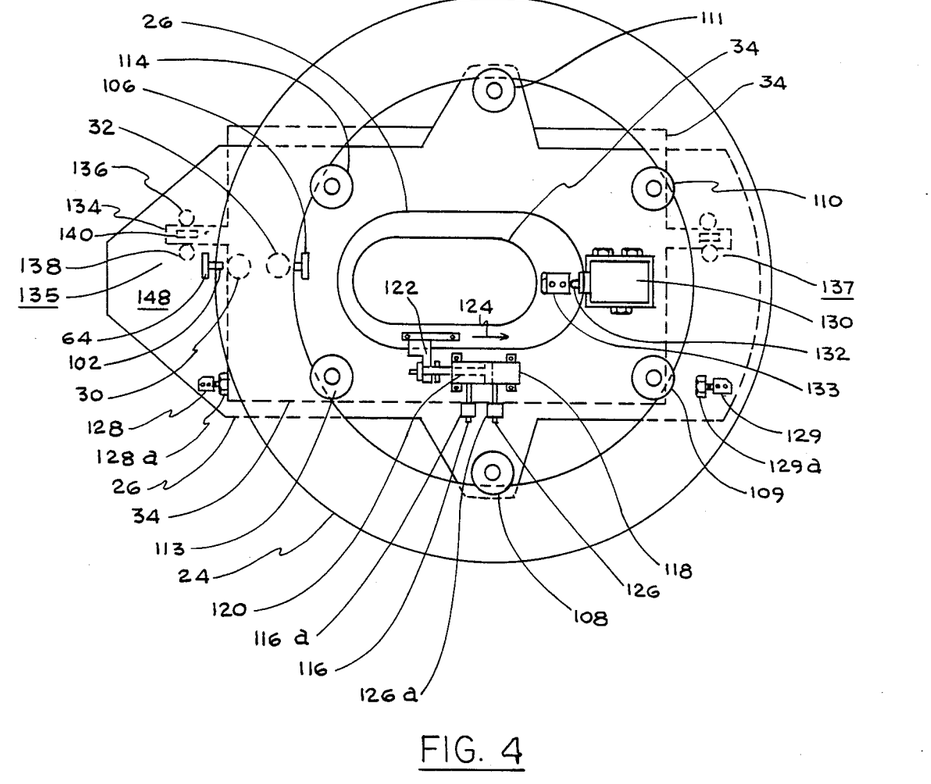
FIG. 4 is a top view illustrating in greater detail the features of the sample-changer in accordance with the invention.

To avoid returning a sample holder assembly to an occupied chute, an LED/phototransistor assembly 102 (FIG. 2), mounted on vertical support 64 is provided to detect the presence or absence of a spinner. A second LED/phototransistor assembly 104 mounted adjacent to assembly 102 on vertical bracket 64 is utilized for detecting the rotational position of the carousel. More specifically, the phototransistor senses the reflection from a reflective dot (not shown) mounted on one of the chutes (designated chute 0) which holds the first sample to be analyzed. After sequencing through all 50 of the samples in one of the inner or outer rows, the reflective dot is again detected and the carousel either shifts to the next row or stops, depending on the accumulated count in a counter used to monitor the number of samples analyzed. It will be recognized that by adding more sensors (or bits) and encoding each chute, the system could positively identify the position of the carousel. The description hereinbefore has been with reference to vertical bracket 64, pneumatic cylinder 68, and detectors 102 and 104 which service outer chute row 18. As best seen in FIGS. 1 and 4, however, it should be recognized that there is provided a second vertical bracket 106 having its own pneumatic cylinder (not shown) and spinner detector (not shown) and which services in a similar manner inner concentric chute row 16.

The manner in which either the inner or outer row of chutes is positioned over passageway 12 (by movement of the shifter plate) will now be described with reference to FIG. 4 which is a top view of the carousel bottom plate 24, shifter plate 26 and fixed plate 34. The carousel is supported and journalled for rotation on top of shifter plate 26 by means of four bearings 108–111 and is additionally guided in its rotational movements by bearings 113 ad 114, which bearings are mounted to the top of shifter plate 26. In the position shown, the shifter plate is positioned to accept sample holders from inner chute row 16 (FIG. 1). In this position, opening 32 (FIG. 2) in the shifter plate is in alignment with passageway 12. To position opening 30 in shifter plate 26 in alignment with passageway 12 to accept sample holders from outer chute row 18, compressed gas is applied to port 116 of a pneumatic cylinder 118 mounted on the shifter plate causing piston 120 to move and engage a bracket 122 mounted to fixed plate 34. As a result, the shifter plate and the carousel mounted thereon move in the direction indicated by arrow 124. In this situation, port 126 acts as the cylinder exhaust vent. To obtain movement in a direction opposite to that of arrow 124, the roles of ports 116 and 126 are reversed, such that compressed air is applied to port 126 while port 116 acts as the exhaust vent. Needle valves 116a and 126a associated with ports 116 and 126, respectively, are provided for regulating the speed with which the shift plate travels from one position to the other. The range of travel of the shift plate, hence, the carousel, is between plate stops 128 and 129 mounted to the underside of the shift plate. The extremes of the travel range can be adjusted by turning threaded bolts 128a and 129a as needed to ensure proper alignment between openings 30 and 32 and passageway 12.

An additional feature which should be noted with reference to FIG. 4 is a valve 130 mounted to the top of shifter plate 26 and which is provided with an actuator 132 which works against a bracket 133 mounted to fixed plate 34. Actuator 132 is either compressed or relaxed depending on whether the opening 30 or 32 is in alignment with passageway 12 so that compressed air is provided to the correct pneumatic cylinder (such as cylinder 68, FIG. 2) for operating the sample release catch.

Figure 5:
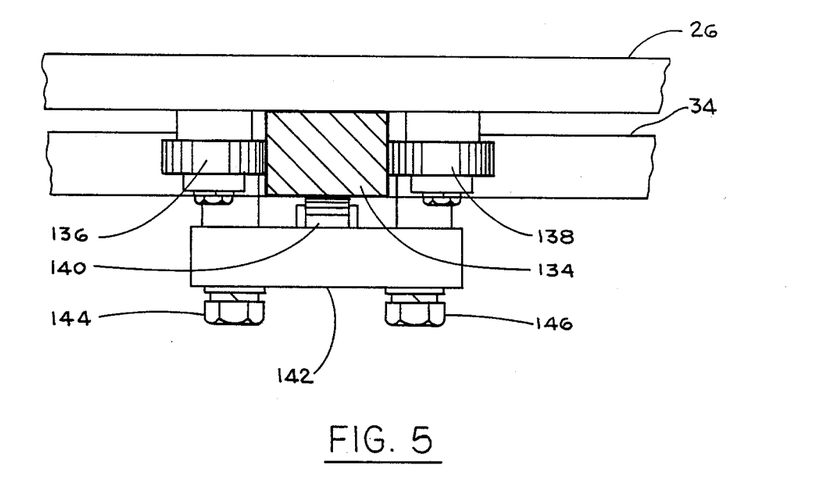
FIG. 5 illustrates details of a guidance system mounted to the underside of a shifter plate which is part of the sample changer.

FIG. 4 also shows two identical guide assemblies generally designated 135 and 137 which guide the movements of the shifter plate. A detailed description of the guide assembly will be undertaken by way of example with reference to assembly 135, an end view of which is depicted in FIG. 5. The assembly includes a guide rail 134, which is either an integral part of fixed plate 34, as shown, or can also be a separate member which is bolted to the fixed plate. Positioned to either side of rail 134 is a pair of bearings 136 and 138 which are secured to the underside of shifter plate 26. An additional retainer bearing 140 is journalled for rotation on a support bar 142 which is secured to the underside of the shift plate by means of a pair of bolts 144 and 146. The function of the retainer bar and the support bearing is to hold the shifter plate and the carousel mounted thereon in position.

Figure 6:
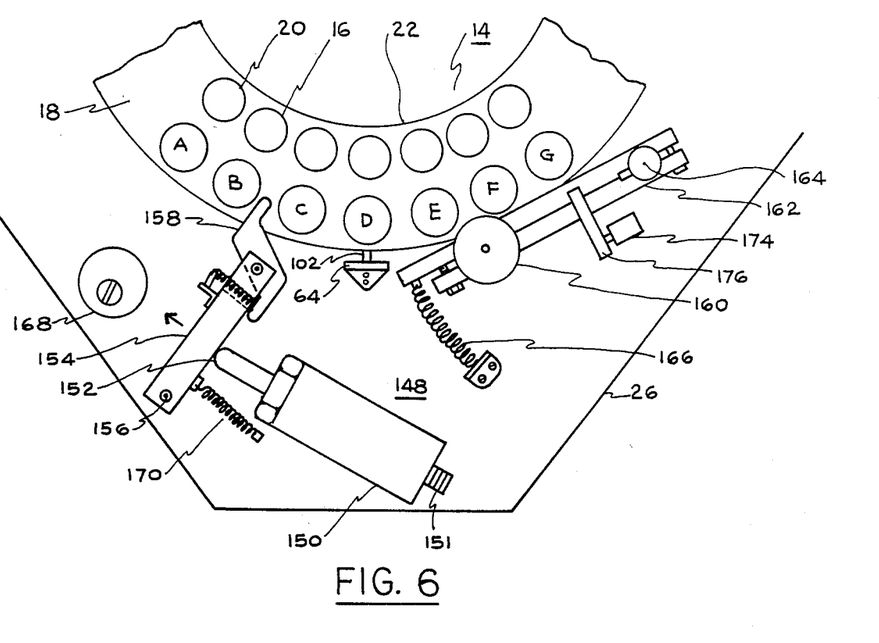
FIG. 6 is a top elevational view of a detent mechanism which functions to rotate the sample changer.

The manner in which the carousel is rotated from one chute position to the next will now be described with reference to FIG. 6. The rotate mechanism depicted in FIG. 6 is mounted in the area of shift plate 26 generally designated 148 in FIG. 4. Continuing with reference to FIG. 6, to rotate carousel 14, compressed air is supplied to a pneumatic cylinder 150 through port 151 causing plunger 152 to exert a force against drive arm 154 so that it pivots about point 156 and a dog 158 affixed to the other end of the drive arm exerts a force against chute B, causing the carousel to rotate. As the carousel rotates, a detent tire 160 mounted on a detent arm 162 which pivots about a pivot point 164 rolls around chute F, compressing a detent spring 166. When chute F has rotated past the center line of the detent tire, drive arm 154 comes to rest against an adjustable stop 168. Detent spring 166 continues to relax until the tire is wedged between chutes F and G, so that chute E is now above the passageway 12. A microswitch 174, mounted on shifter plate 24 and operated by a lever 176 attached to detent arm 162, senses the position of the carousel to determine that it has rotated properly to the next detent position. The openings in the shifter plate are arranged so that when the carousel is in its detent position rotationally, either the outer or the inner chute is positioned over passageway 12. Pneumatic cylinder 150 is vented and a drive spring 170 returns the drive arm to its rest position against plunger 152 which, itself, is returned to its rest position by a spring (not shown) which resides within the pneumatic cylinder. When the sample in chute E has been analyzed and returned to its rest position, the carousel is advanced so that the sample in the next chute can be processed in a similar manner. The procedure can be repeated until all of the samples stored in the carousel are tested. In the manner described hereinbelow, the process can be automated by a programmed computer.

Figure 7:
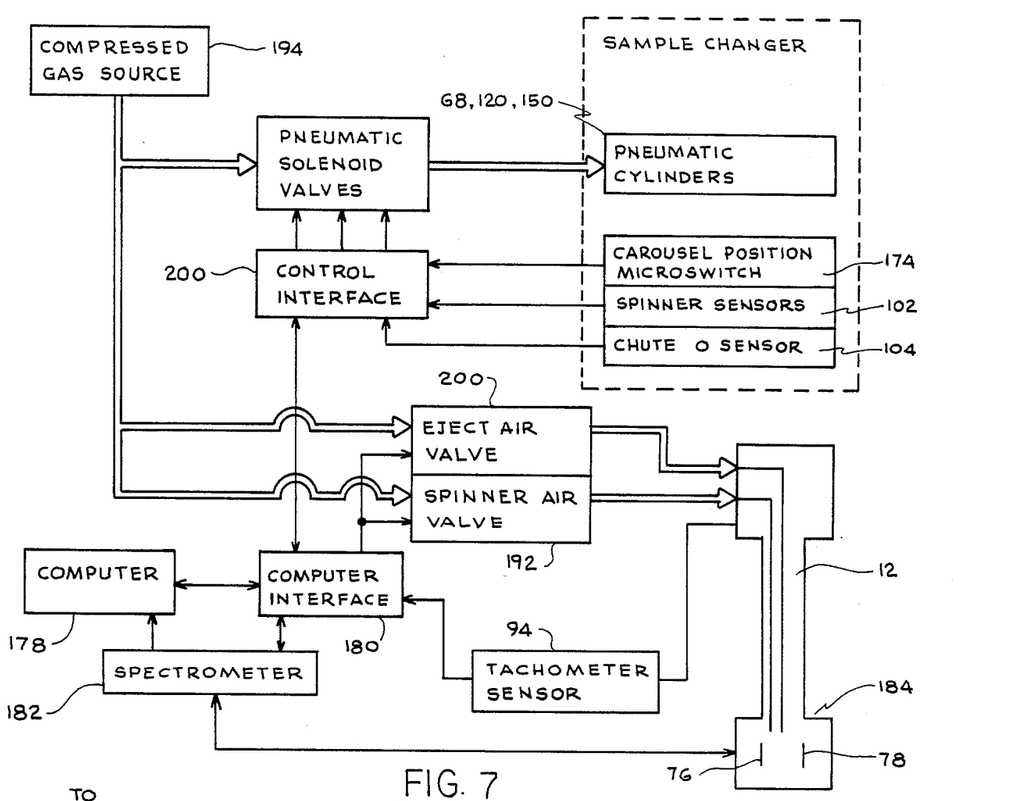
FIG. 7 is a schematic block diagram of a spectrometer system in accordance with the present invention.
Figure 8:
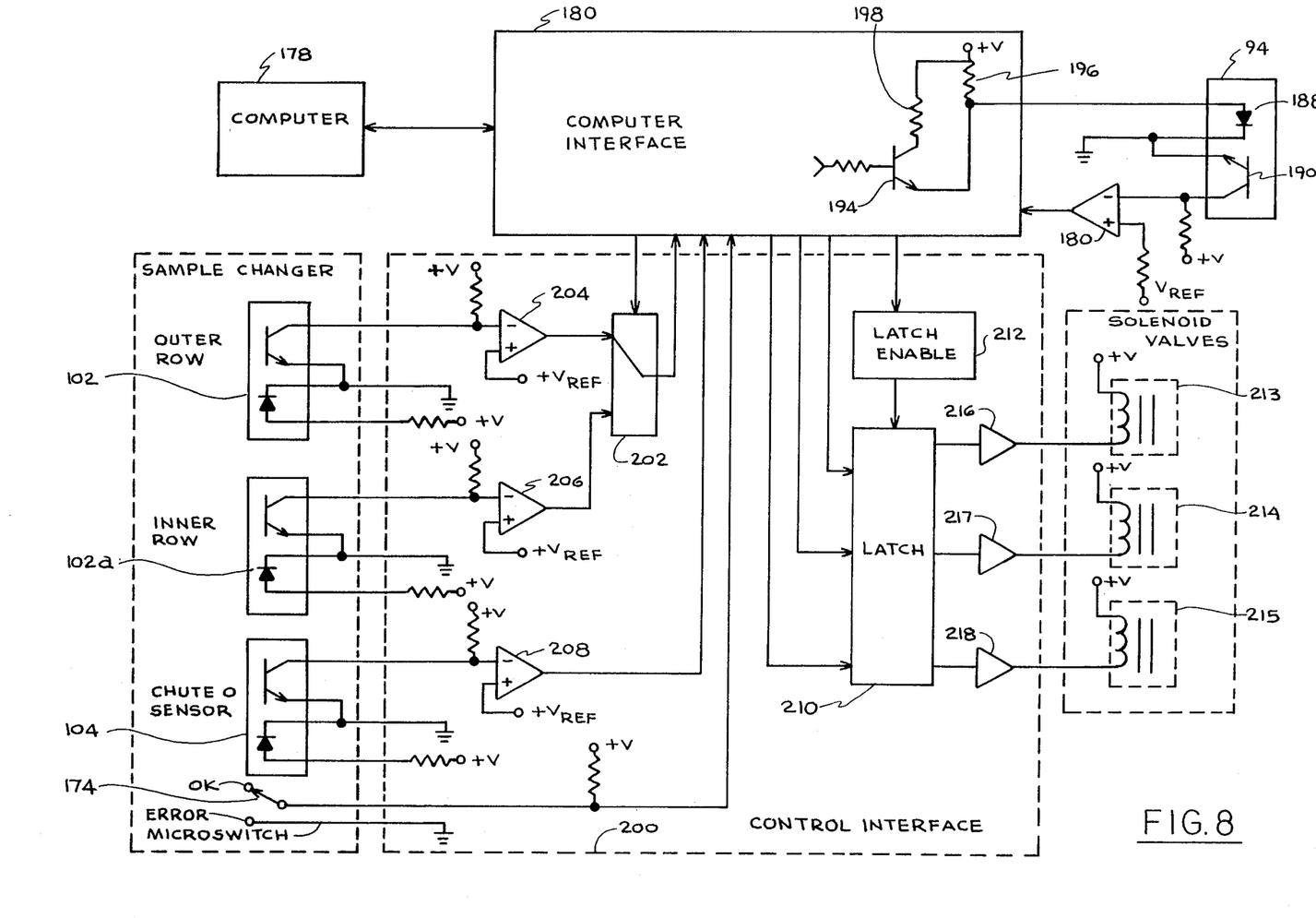
FIG. 8 is a more detailed schematic block diagram of the spectrometer system depicted in FIG. 7.

The manner in which the spectrometer system operates in conjunction with the carousel will now be disclosed with reference to FIGS. 7 and 8 in which like parts are assigned the same reference numbers as in FIGS. 1-6. The system comprises a computer 178 which may be a Nicolet Instruments Model 5DX and which communicates with a computer interface 180 and a spectrometer 182. The spectrometer communicates with the computer interface and a probe 184 which houses RF coils 76 and 78 used to couple RF energy to the sample and to sense the NMR signal. Interface 180 receives information about either sample rotating speed or absence/presence of a sample spinner in the probe through a differential comparator 186 from tachometer sensor 94 which comprises an LED 188 and a phototransistor 190. Sample rotational speed is determined by, for example, monitoring a pulse train generated by the phototransistor as it monitors LED light reflections from reflective areas (95–97, FIG. 3) on the spinner. The pulse train frequency is proportional to the spin rate of the spinner. The speed at which the sample rotates can be adjusted based on information received from the tachometer sensor by a spinner air valve 192 (housed at the top of passageway 12) which regulates gas flow from a compressed gas source 194 to turbine stator 80 (FIG. 3). The presence or absence of a sample spinner in the probe is determined by measuring light reflection either off the spinner body, itself, or from one of the reflective areas thereon. The light output of LED 188 can be increased for reliably detecting reflections off the spinner body (which is less reflective than the reflective areas) by increasing the current therethrough. This is accomplished by applying a bias signal to the base of normally non-conductive transistor 194, biasing it into conduction so that resistances 196 and 198 appear in parallel thereby reducing load resistance and increasing current through the LED. It is desirable to sense, for example, whether a spinner has reached the probe after release from the carousel and to avoid releasing a second sample into an occupied probe. An eject air valve 200, coupled to the compressed air source and to computer interface 180, provides compressed gas to eject the sample upon completion of analysis. The eject air valve is also activated to pressurize passageway 12 so that when a sample holder is released, the pressurized gas escapes slowly around the spinner and slows the descent of the sample holder into the probe.

The computer interface 180 also communicates with a control interface 200 which receives signal inputs from carousel position microswitch 174, spinner sensors 102 and 102a, and chute sensor 104. Control interface 200 provides drive signals to pneumatic solenoid valves 213–215 which connect compressed gas from source 194 to pneumatic cylinders 68, 120 and 150, in a manner which will be described next in greater detail with reference to FIG. 8.

FIG. 8 shows sensor 102, 102a, and 104 and microswitch 174. Sensors 102 and 102a are substantially identical to tachometer sensor 94 and are coupled, one at a time, to computer interface 180 through an electronic switch 202 which selects the output of one of differential comparators 204 and 206 coupled to sensors 102 and 102a, respectively. The information provided by sensors 102, 102a, and 94 is useful in determining sample status. Thus, if a sample has been either released or ejected, by monitoring the sensors, it can be determined whether the sample has arrived at its destination or is stuck between the at-rest position in the carousel and the probe.

Sensor 104, in the embodiment depicted in FIG. 2, indicates the presence of a reflective area (chute=0) as predetermined on one of the chutes in the outer chute row. This information is coupled to interface 180 by a differential comparator 208. In one embodiment, samples in the outer row are analyzed first so that sensor 102 is monitored. When sensor 104 again detects the reflective area, and depending on count in a counter maintained by computer 178, switch 202 is signalled to select the output of sensor 102a which is used to monitor samples in the inner carousel row. Carousel rotation from one detent position to the next is monitored by microswitch 174 which provides an "error" signal if the rotation is abnormal and, therefore, that the chute is not aligned with passageway 12. The "low-to-high" logic transitions of the microswitch are used to increment the computer counter which accumulates an incremental total of the number of chutes examined. This count is used in the operation of the spectrometer as will be described with reference to the truth table depicted in FIG. 12.

Continuing with reference to FIG. 8, computer interface 180, under control of computer 178, provides control signals to a latch 210. The signals are gated through the latch by a latch-enable circuit 212. The latch transmits signals to solenoids in pneumatic valves 213–215 through drivers 216–218, respectively, only upon receiving a proper enable signal from enable circuit 12 within a predetermined time, thereby minimizing spurious activation due to random transients.

Figure 9:
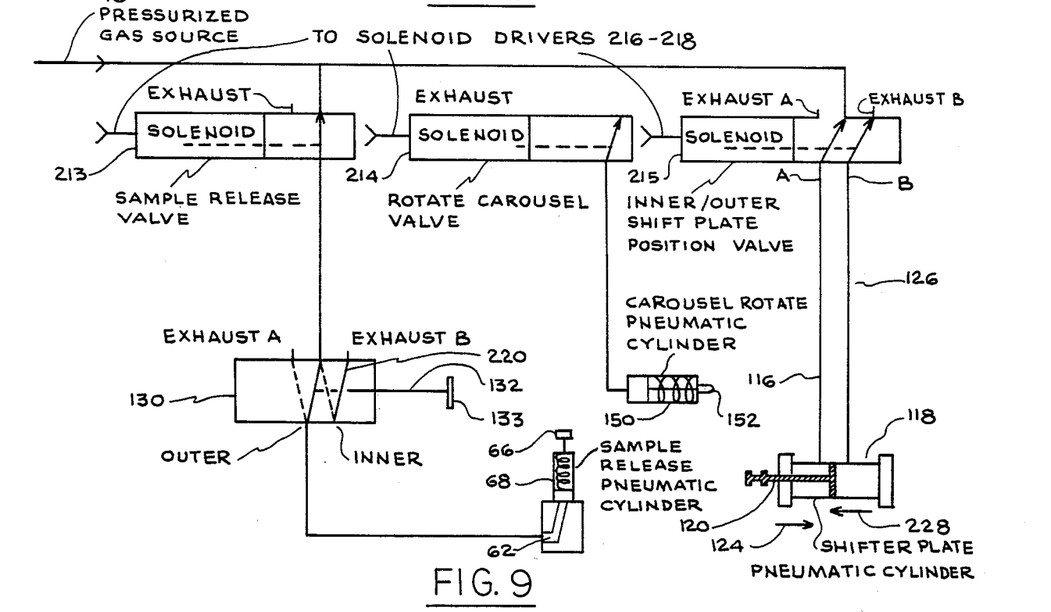
FIG. 9 is a hydraulic system schematic of the spectrometer incorporating features of the invention.

Referring now to FIG. 9, to release a sample positioned in the outer chute row, for example, the solenoid of pneumatic valve 213 is activated by a drive signal from drive 216 causing the pump to direct compressed gas to valve 130. Compressed gas is directed to either the inner or outer valve port, depending on the position of valve actuator 132 as determined by the position of the shifter plate. As shown in FIG. 9, the plunger directs compressed gas to the outer sample release cylinder 68 activating plunger 66 thereof to release catch 52 (FIG. 2). To select inner pneumatic cylinder (not shown), mounted to inner bracket 106 (FIG. 1), actuator 132 would be biased by bracket 133 (due to a change in the position of the shifter plate) so that compressed air would be connected to conduit 220 which sources the inner cylinder.

Carousel rotation is accomplished by energizing pneumatic valve 214 by a drive signal from driver 217 so that pneumatic cylinder 150 is connected to the source of compressed gas thereby activating plunger 152 which acts to rotate the carousel in a manner described hereinabove.

Similarly, shifting between the inner and outer chute rows is achieved by applying an enable signal to pneumatic valve 215 from driver 218. In a first position, the valve directs compressed gas through line 116 causing piston 120 to move in the direction of arrow 124. In this case, line 126 acts as the exhaust for venting compressed gas. To move the shift plate in the direction of arrow 228, which is directed opposite to arrow 124, compressed gas is applied to line 126, while line 116 acts as an exhaust. In this manner, supplying compressed gas to either line 116 or 126 causes piston 120 to positively move in either the direction of arrow 124 or 228, respectively, causing the shifter plate to move in the direction of one or the other of the arrows.

Figure 10:
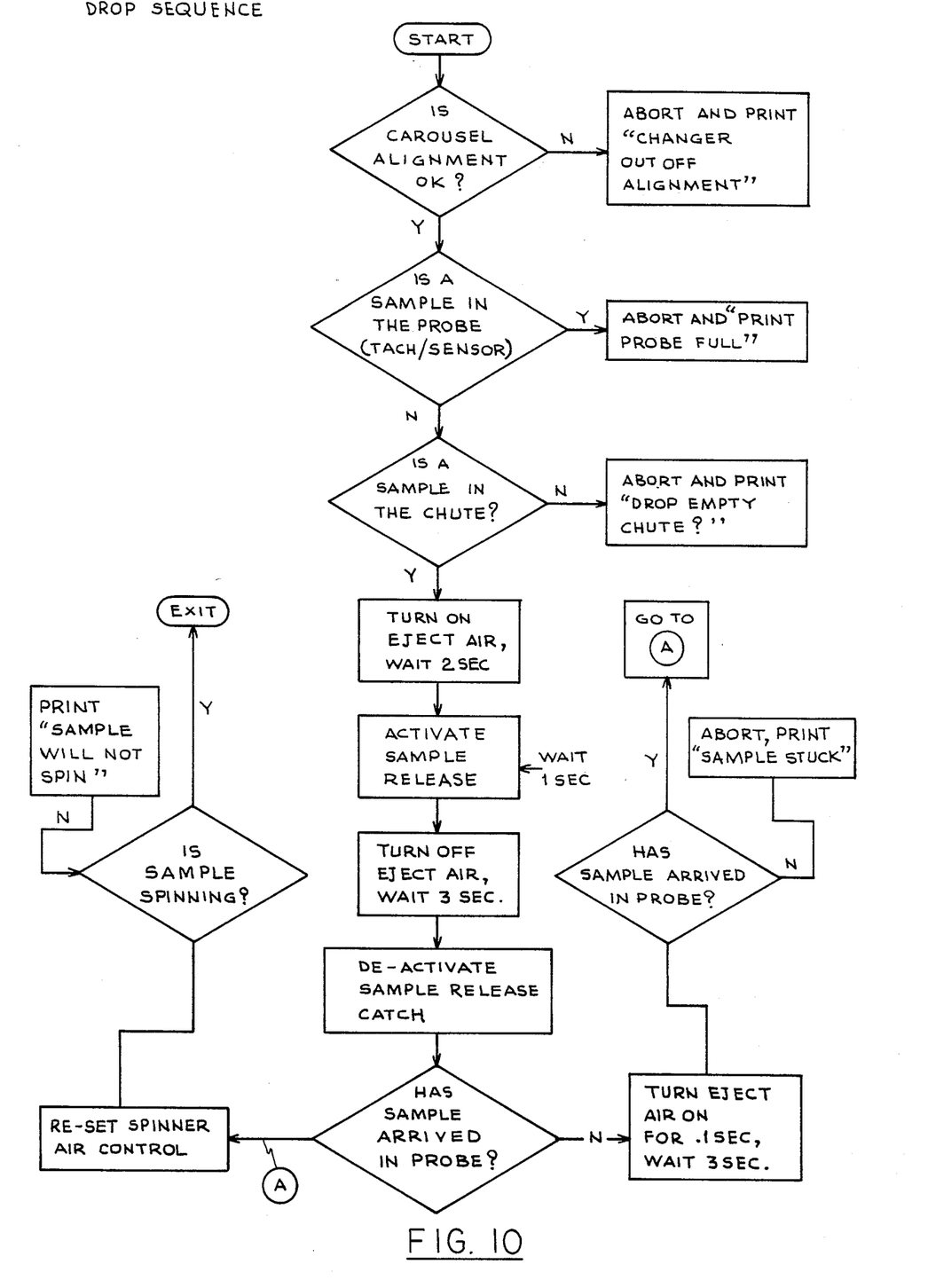
FIGS. 10–13 illustrate in flow-chart format sample drop, sample eject, sample changer rotate, and shift plate sequences, respectively.

FIG. 10 depicts in flow-chart format the sequence of events and tests carried out in releasing a sample from the carousel into the probe. Initially, the microswitch sensor is checked to determine that the sample chute is aligned with the magnet passageway. It is, next, necessary to determine whether there is a sample already in the probe and whether a new sample is available to be dropped by reading the tachometer and spinner sensors, respectively. Once it is determined that the probe is unoccupied and that a sample is available, the sample catch is released allowing the sample to drop, following which the sample catch is allowed to return to its rest position. Prior to performing the analysis, a check is performed to determine that the sample reached the probe. If it has not, an attempt is made to dislodge it in the passageway by applying a burst of eject air. Once a sample has been determined to have reached the probe, compressed air is applied to the spinner to rotate the sample and sample analysis is performed.

Figure 11:
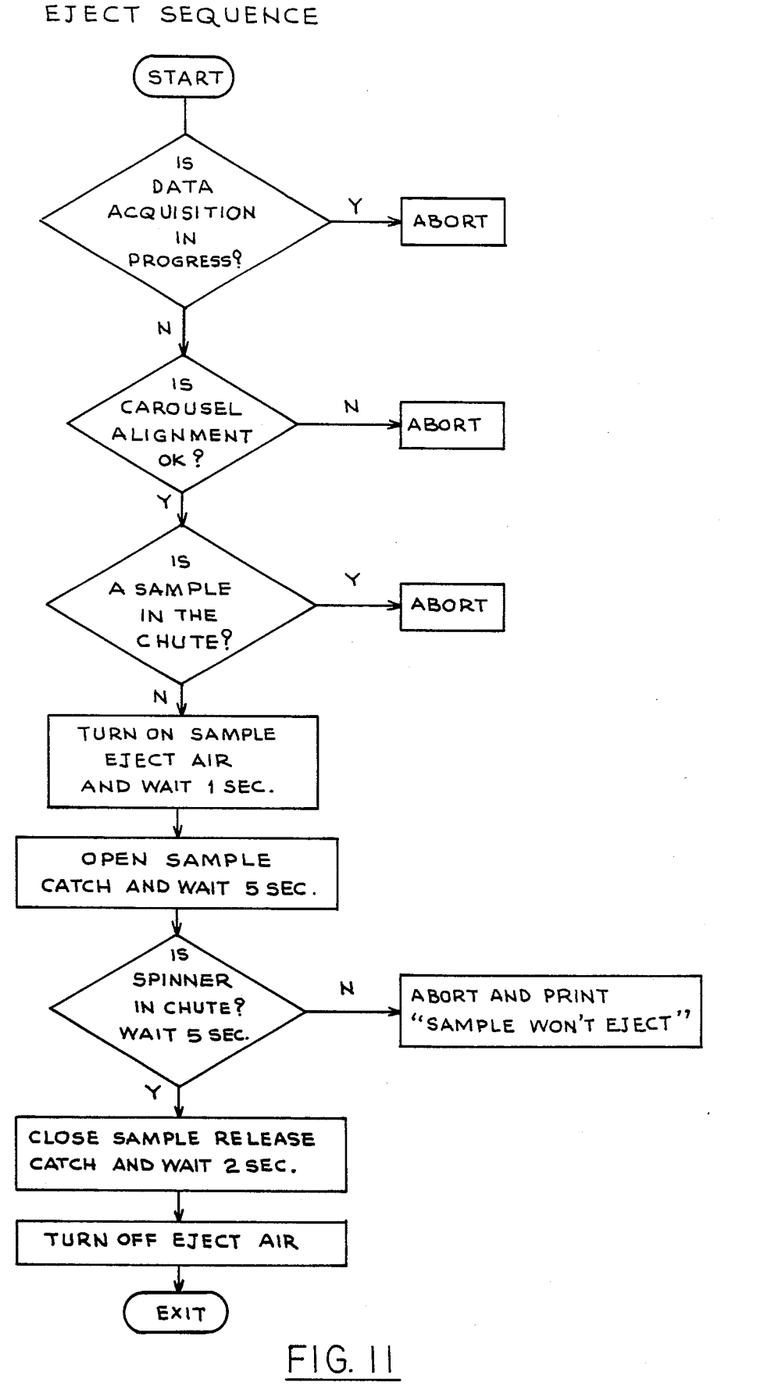

The sequence for ejecting a sample is depicted in flow-chart format in FIG. 11. Several tests are performed to determine that a sample can be safely ejected. It is necessary to establish that data acquisition has been completed, that an empty chute is available for receiving the sample and that the carousel is properly aligned. The sample is returned to its rest position in the chute by applying eject air and opening the sample catch. Once a sample is detected as having arrived in the chute, the catch is released to hold the sample in its rest position.

Figure 12:
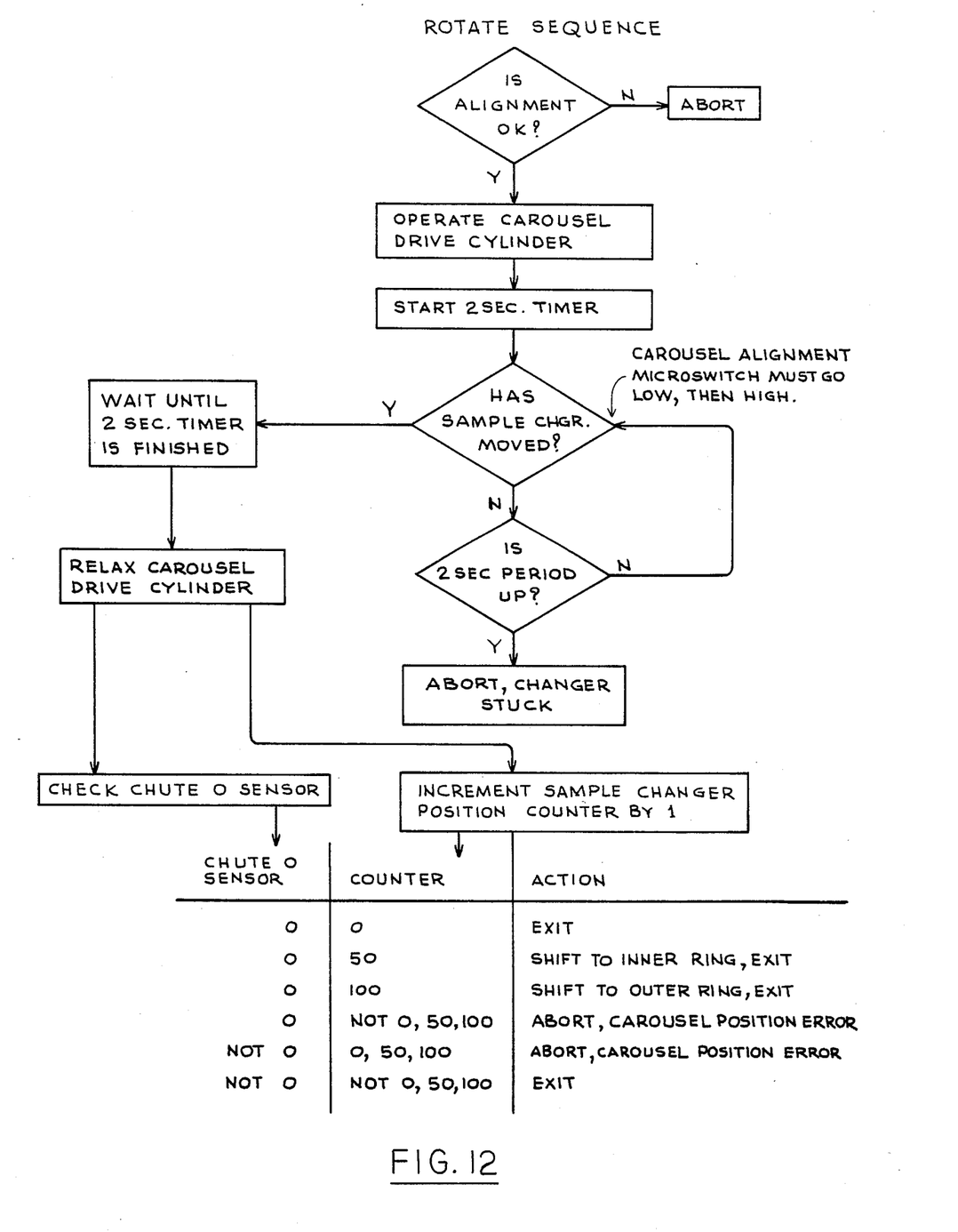

The flow chart shown in FIG. 12 depicts the sequence for rotating the sample changer. Prior to initiating the rotate sequence, a check is performed to determine that the carousel is properly aligned. A positive response results in the activation of the rotate pneumatic cylinder and the start of a two-second timer. If at the end of two seconds the microswitch output has not changed to low logic level and then to high, the carousel is stuck and the sequence is aborted. Assuming rotation occurred normally, after the two-second timer has run down, the carousel drive cylinder is relaxed and the count of the incremental counter is incremented by one. A series of tests is also performed to determine the next step in the operating sequence. This sequence of tests is summarized by the truth table in FIG. 12. Thus, if the chute sensor senses the first chute having a reflective area thereon (chute=0) and the incremental counter reads zero, a normal exit is performed and the sequence continues. When the chute sensor reads "0" and the counter reads "50," indicating that all samples in the outer row have been analyzed, the shifter plate is shifted to the inner chute row and sample analysis continues. When all of the samples in the inner row have been analyzed (i.e., chute=0 and counter=100), the carousel is shifted to the outer ring and sequence is terminated. A chute sensor reading of "chute does not equal 0" and counter does "not equal either 0, 50, or 100" indicates that not all samples have been analyzed and that normal operation should continue. There are also two situations which indicate a carousel position error and that normal operation should be aborted. The first of these is that the chute detector reads "0," but the counter indicates "not 0, 50 or 100." The second condition is that chute reading is "not 0," but the counter indicates one of "0, 50, or 100."

Figure 13:
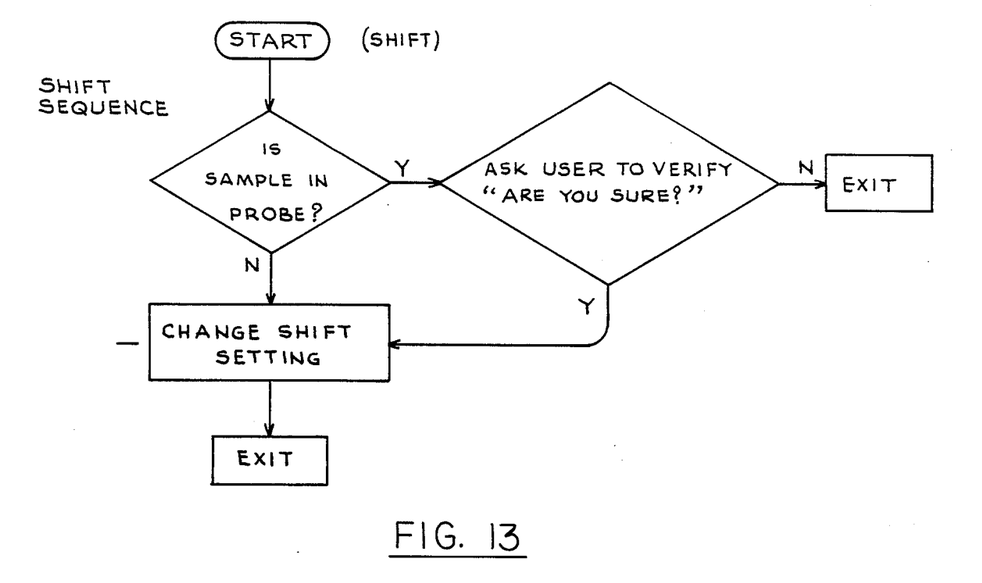

FIG. 13 depicts in flow-chart format the sequence for shifting the shifter plate between the inner and outer chute rows. This sequence and the rotate sequence (FIG. 12) both assume that the user wants to eject the sample back to the same chute from which it was dropped. Therefore, if a command to rotate or shift is given and the sample is in the probe, the user is asked to verify to ensure that an error has not occurred.

It will be recognized that the operational sequences disclosed with reference to FIGS. 10-13 can be, and in fact are, implemented as programmed sets of instructions in the computer and permit the spectrometer and the sample changer to operate in an unattended manner.

From the foregoing, it will be recognized that in accordance with the invention there is provided a improved NMR spectrometer having an improved mechanism for selecting, positioning and retrieving an NMR sample at an increased rate and which is capable of either manual or unattended operation. The mechanism does not require modifications to the existing magnet structure.

While this invention has been described with reference to particular embodiments and examples, other modifications and variations will occur to those skilled in the art in view of the above teachings. Accordingly, it should be understood that within the scope of the appended claims the invention may be practiced otherwise than is specifically described.

The invention claimed is:

1. A gyromagnetic resonance spectrometer apparatus having a probe structure for holding a sample to be analyzed in an unidirectional magnetic field, means for supporting a plurality of sample holders, a passageway communicating with said means for supporting and said probe structure through which said sample holders are loaded and retrieved from the probe structure, and means for exciting and detecting a gyromagnetic resonance of the sample immersed in the polarizing magnetic field, said means for supporting comprises:

means for releasably supporting said plurality of sample holders, which holders are arranged in at least two rows;

means for sequentially loading successive ones of said sample holders in one of the rows into said probe structure;

means for ejecting said sample holder from said probe structure; and means for sensing when the samples in the one of said rows have been analyzed and for shifting said means for supporting so as to align the other of said rows of sample holders with said passageway to enable sequential analysis thereof.

2. The spectrometer apparatus of claim 1 wherein said means for releasably supporting comprises at least two concentric rows of chutes supported between upper and lower plates, each of said chutes having means for housing in a rest position a sample holder, said chutes and said upper and lower plates collectively forming a carousel assembly.

3. The spectrometer apparatus of claim 2 wherein said carousel assembly is rotatably mounted on a movable shifter plate such that in a first position of the shifter plate a predetermined one of the chutes in one of said rows is in alignment with said passageway, and in a second position of said shifter plate a predetermined one of the chutes in the other one of said rows is in alignment with said passageway.

4. The spectrometer apparatus of claim 3 further comprising:

pneumatic cylinder means;

drive arm means actuated by said pneumatic cylinder means for rotating said carousel assembly such that chutes in one of said rows are successively positioned in alignment with said passageway; and detent arm means coupled to sensing means for detecting the rotational position of said carousel assembly.

5. The spectrometer apparatus of claim 2 wherein each of said chutes is provided with pneumatically operable catch release means for supporting the sample holder in the rest position, and for releasing the sample holder when a predetermined one of said chutes is in alignment with said passageway.

* * * * *

UNITED STATES PATENT AND TRADEMARK OFFICE
CERTIFICATE OF CORRECTION

PATENT NO. : 4,581,583

DATED : April 8, 1986

INVENTOR(S) : Roy D. Van Vliet and James F. Gordon

It is certified that error appears in the above-identified patent and that said Letters Patent is hereby corrected as shown below:

Col. 1, line 28, after "somewhat" insert --slow--.

Signed and Sealed this

Twenty-fourth Day of March, 1987

Attest:

DONALD J. QUIGG

Attesting Officer

Commissioner of Patents and Trademarks